United States Patent [19]

Wheatley, Jr.

[11] 3,786,364

[45] Jan. 15, 1974

[54] SEMICONDUCTOR AMPLIFIER PROTECTION

[75] Inventor: Carl F. Wheatley, Jr., Somerville, N.J.

[73] Assignee: RCA Corporation, New York, N.Y.

[22] Filed: Mar. 25, 1969

[21] Appl. No.: 810,225

[30] Foreign Application Priority Data

Sept. 27, 1968 Great Britain .................... 46153/68

[52] U.S. Cl. ............... 330/207 P, 307/202, 330/17, 330/22, 330/38 M

[51] Int. Cl. ............................................ H03f 21/00

[58] Field of Search ...................... 330/118; 307/202

[56] References Cited

UNITED STATES PATENTS

| | | | |
|---|---|---|---|
| 3,089,098 | 5/1963 | Noe | 330/19 |
| 3,300,659 | 1/1967 | Watlers | 307/202 X |
| 3,160,767 | 12/1964 | Tindall | 307/202 |
| 3,408,589 | 10/1968 | Nishiaka | 330/51 |
| 3,449,598 | 6/1969 | Wright | 307/202 |
| 3,504,285 | 3/1970 | Lemen | 307/202 X |

*Primary Examiner*—Herman Karl Saalbach
*Assistant Examiner*—James B. Mullins
*Attorney*—Eugene M. Whitacre and Kenneth R. Schaefer

[57] ABSTRACT

A protection transistor is connected between the input electrodes of a transistor amplifier. A fixed bias voltage approximately equal to the base-emitter threshold of conductivity of the protection transistor and a voltage porportional to the current through the amplifier transistor are applied between the base and emitter electrodes of the protection transistor.

11 Claims, 4 Drawing Figures

INVENTOR
CARL F. WHEATLEY, JR.
BY Eugene M. Whitacre
ATTORNEY

INVENTOR
CARL F. WHEATLEY, JR.
BY Eugene M. Whitacre
ATTORNEY

SEMICONDUCTOR AMPLIFIER PROTECTION

This invention relates to semiconductor amplifiers and, in particular, to protection circuits for transistor amplifiers.

Amplifiers constructed with semiconductor devices are supplied for use in many environments. These environments may include high or low temperature operation with or without heat sink protection, and output load mismatch including reactive loads from short circuit to open circuit. These variations in environment necessitate that the power output performance and circuit dissipation be limited to prevent thermal destruction of the semiconductor device.

The device vendor provides a power dissipation rating according to a maximum average junction temperature which must be observed under penalty of thermal destruction of the unit. These limits have been observed primarily by setting amplifier dissipation for worst case conditions such as reactive loads according to the high temperature power dissipation capabilities of the transistor and heat sink structures provided. Fixed limits on transistor dissipation in a given application sacrifice amplifier power output capabilities at low temperatures when driving the design load in order to protect and limit its dissipation at the high temperature extreme.

Prior transistor amplifier protection circuits, while thermally coupled to the same environment as the transistor being protected, did not sense the instantaneous heat changes in the transistor because of the time it takes for the heat to be conveyed through the thermally massive external heat dissipating structures. As a consequence, the margin of safety required to take this lag into account required fixed transistor dissipation limits on expected collector junction temperatures in an operational situation using efficient heat dissipation structures. Accuracy of such estimated collector junction temperatures is subject to the wide variables in structure assembly and environmental conditions. As a result the safety margin required does not permit optimum utilization of transistor characteristics.

It is an object of this invention to provide an improved protection circuit for transistor amplifiers which permits substantial changes in transistor dissipation with changes in the temperature of the transistor.

It is another object of this invention that the amplifier device dissipation limit as provided by a protection circuit be a function of the device semiconductor temperature to more nearly match the semiconductor device capabilities.

A transistor amplifier circuit embodying the invention includes a protection transistor electrically coupled between the input electrodes of the amplifier transistor, and thermally coupled thereto. A direct voltage bias is applied to the input electrodes of the protection transistor to effect transistor conduction above a limit temperature. Circuits embodying the invention are particularly suitable for use in integrated circuits where effective thermal coupling is achieved.

Other objects and features of this invention will become apparent when referring to the following specification in reference to the accompanying drawings in which.

Figure 1:
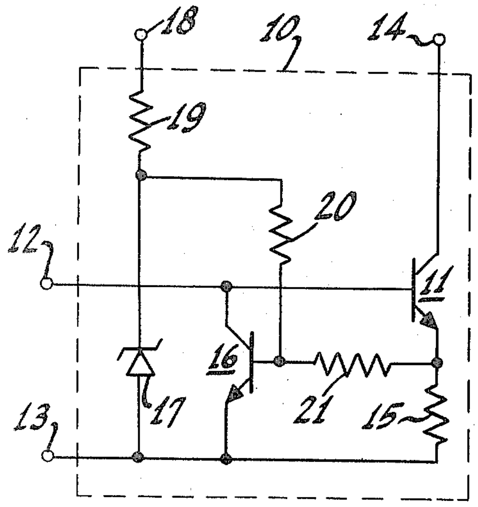
FIG. 1 is a schematic circuit diagram of an amplifier transistor and a protection transistor circuit constructed on the same semiconductor chip.

The dashed rectangle 10 in FIG. 1 indicates that the transistor amplifier and associated protection circuit is an integrated circuit with all of the elements within the rectangle formed on a single semiconductor wafer. The amplifier comprises a junction transistor 11 which is driven by an input signal source, not shown, which is coupled between an input terminal 12 and a common terminal 13. The collector electrode of transistor 11 is coupled to an output terminal 14 and the emitter electrode is coupled to the common terminal 13 by a current sampling resistor 15.

The protection circuit comprises a junction transistor 16 which is electrically coupled across the input signal source. The transistor 16 base and emitter electrodes are coupled across the current sampling resistor 15. In normal operation transistor 11 is biased as the active element of a signal amplifier. For normal currents in transistor 11, transistor 16 is not conductive and represents an open circuit across the input signal source. When the current in transistor 11 exceeds a predetermined threshold value, the voltage developed across the current sampling resistor 15 is of a value to permit conduction of transistor 16. Conduction of transistor 16 will load the signal source coupled to terminals 12 and 13, limiting the amplitude of signal voltage applied to the transistor 11.

The base-emitter junction of transistor 16 is a semiconductor diode having a threshold of conductivity which varies inversely as a function of the semiconductor temperature. Since transistor 16 and transistor 11 are constructed on the same semiconductor wafer or chip, this threshold of conductivity is also an inverse function of the semiconductor temperature of transistor 11. As the integrated circuit chip heats up, due to environmental or internal dissipation, the signal amplitude at which the transistor 16 begins to conduct and limit the applied signal is reduced by the decreasing threshold of conductivity.

A direct voltage source comprising a Zener diode 17 is maintained in conduction by an external supply, not shown, coupled through terminal 18 and resistor 19. This voltage source provides a fixed direct current flow substantially independent of signal currents, though not necessarily independent of temperature, through resistors 20, 21 and 15. The relative ohmic values of resistors 21, and 15 is such that the fixed voltage drop developed across resistor 21 due to the constant current is large relative to that developed across resistor 15. The polarity of the direct current flow is chosen to provide a bias voltage polarity which is in the direction to forward bias transistor 16. The transistor 11 current through the resistor 15 also causes a voltage to be developed which is in a direction to forward bias the transistor 16. When the sum of the voltages across the resistors 15 and 21 exceeds the threshold of conductivity of transistor 16, that transistor conducts and diverts any additional signal source current from transistor 11.

The signal voltage $V_s$ developed across resistor 15 required to exceed the threshold of conductivity of transistor 16 may then be described as follows:

$$V_s = V_{beo} - K \Delta T - V_{bias}$$

The temperature dependence $K \Delta T$ of the transistor 16 threshold voltage is described as a linear function of the change in temperature $\Delta T$ with respect to the threshold of conductivity $V_{beo}$ at a reference temperature. Thus if temperature increases ($+ \Delta T$), $V_s$ decreases, whereas if temperature decreases ($- \Delta T$), $V_s$ increases. As the bias voltage $V_{bias}$ is made large enough to approach $V_{beo}$, $V_s$ becomes very small thereby permitting a small increment in chip temperature $\Delta T$ to initiate protection transistor conduction. Chip temperature then effects protection transistor conducting limiting amplifier transistor dissipation and limiting chip temperature rise. Thermal time delays between two adjacent transistors on a single chip have been measured at less than 1 millisecond.

To assist in the design of semiconductor amplifier circuits, manufacturers of transistors provide graphs or charts showing percentage of maximum rated power dissipation as a function of temperature. For reference to such a chart, see page 112 of the *RCA Transistor Manual SC*-12, published by the Radio Corporation of America, Electronic Components & Devices, Harrison, N.J.

In prior art circuits, protection for the transistor was provided by determining the desired power dissipation in the transistor to be used, and limiting the temperature of the semiconductor material of the transistor to a safe value for that dissipation by an appropriate heat sink structure. Thus, as the power dissipation in the transistor is pushed to its limit, the size and effectiveness of the heat sink structure must be correspondingly increased. In operation, if the transistor dissipation exceeds the desired limit, insufficient heat may be removed by the heat sink causing the semiconductor temperature to rise to a level which may destroy the transistor. It may be noted that where the transistor is operating at lower temperatures, the power dissipation is limited to approximately the safe value prescribed for higher temperature even through the transistor could safely dissipate a greater power when operating at the lower temperature.

In prior art circuits, not including the fixed bias voltage developed across the resistor 21 or the effective thermal coupling as is achieved in integrated circuit structure, a compromise as to the maximum power dissipation of a given transistor and the maximum temperature at which the transistor material can operate must be made. For example, with reference to FIG. 2, if the maximum desired transistor dissipation at 160°C is achieved at a current $I_1$, then the maximum semiconductor temperature should not safely exceed 160°C. Accordingly, a heat sink structure of sufficient capacity must be provided to ensure that sufficient heat is dissipated so that the semiconductor temperature of the transistor is maintained at or below 160°C. The design of the heat sink must take into account the expected environmental conditions in which the transistor is to be used. If the semiconductor temperature exceeds 160°C, then prior art protection circuitry will not prevent possible destruction of the transistor. However, prior art circuits serve to limit the transistor power dissipation (current) to safe relatively constant levels for temperatures in the expected temperature range.

Figure 2:
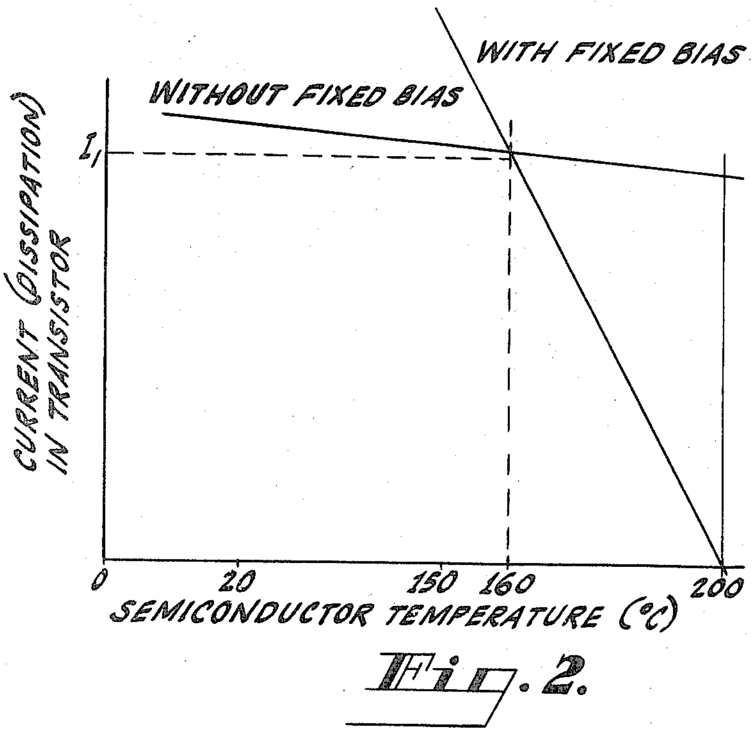
FIG. 2 is a graph showing current limits provided by prior art protection circuits and those provided by this invention.

In accordance with the present invention, the fixed direct voltage bias developed across the resistor 21 provides definite advantages in that the power dissipated in the transistor 11 is permitted to change as a function of the temperature of the semiconductor material. The fixed voltage across the resistors 21 and 15 due to the constant bias current is set at a value which is approximately equal to the threshold of conduction ($V_{be}$) for the upper temperature limit, e.g., 200°C. of operation of the transistor 11. When the semiconductor temperature rises to temperatures higher than the upper limit, transistor 16 conducts, shunting any additional signal or bias current away from the input electrodes of transistor 11. The higher the semiconductor temperatures, the greater is transistor 16 conduction. For lower temperatures, the threshold of conduction ($V_{be}$) of transistor 16 increases, and a greater voltage drop is required across resistors 21 and 15 to divert the signal current from the input electrodes of transistor 11. The current through transistor 11 is sensed by the resistor 15. To establish the value of the resistor 15, the permissible power dissipation is determined from the appropriate charts at a semiconductor temperature lower than the limit temperature, e.g., 160°C. The current through the transistor at this dissipation level can be calculated, and the resistor 15 is selected to have a value such that the voltage developed across it together with the fixed voltage across the resistor 21 is equal to the threshold of conductivity ($V_{be}$) of the transistor 16 at this lower semiconductor temperature. A curve which shows the permissible current in transistor 16 as a function of the semiconductor temperature is shown in FIG. 2 with the legend "with fixed bias." It may be noted that a circuit embodying the invention protects the transistor 11 as a function of semiconductor temperature. As a result, this circuit permits substantially greater transistor power dissipation as the temperature of the transistor semiconductor material decreases.

Figure 3:
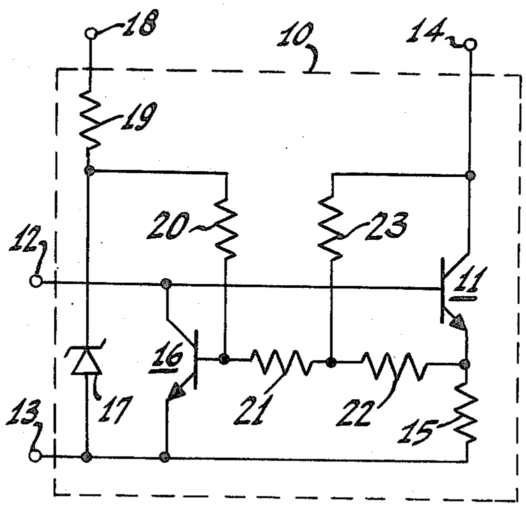
FIG. 3 is a schematic circuit diagram of a protection circuit in accordance with this invention additionally limiting current as a function of the voltage across the transistor.

FIG. 3 shows additional means responsive to instantaneous dissipation in transistor 11 to protect the transistor from excess dissipation as a function of the semiconductor temperature and also as a function of the current through and the voltage across the transistor 11. A pair of resistors 23 and 22 are connected in series across transistor 11 and provide access resistor 22 a fraction of the voltage drop across the transistor 11. The voltage across the series combination of resistor 22 and resistor 15 includes a voltage proportional to transistor current as developed across resistor 15 and a fraction of the voltage across transistor 11 as developed across resistor 22. The sum of the voltages across resistors 15 and 22 is a function of the power dissipation product of the current through and the voltage across the transistor 11. The sum of the voltages across resistors 15 and 22 are combined with the fixed voltage across resistor 21 and applied between the base and emitter electrodes of the protection transistor 16. In this circuit, if the voltage across the transistor 11 is high, current will be limited to a small value. Correspondingly, if the voltage drop across transistor 11 is low, current will be limited at a proportionately higher value. Therefore, transistor dissipation is additionally limited as a function of the voltage across and the current through the transistor, as well as the semiconductor temperature. The limiting of transistor 11 voltage and current is controlled for all output loads including reactive loads to a range of values which approximates the safe area operation of the transistor as a function of temperature.

Figure 4:
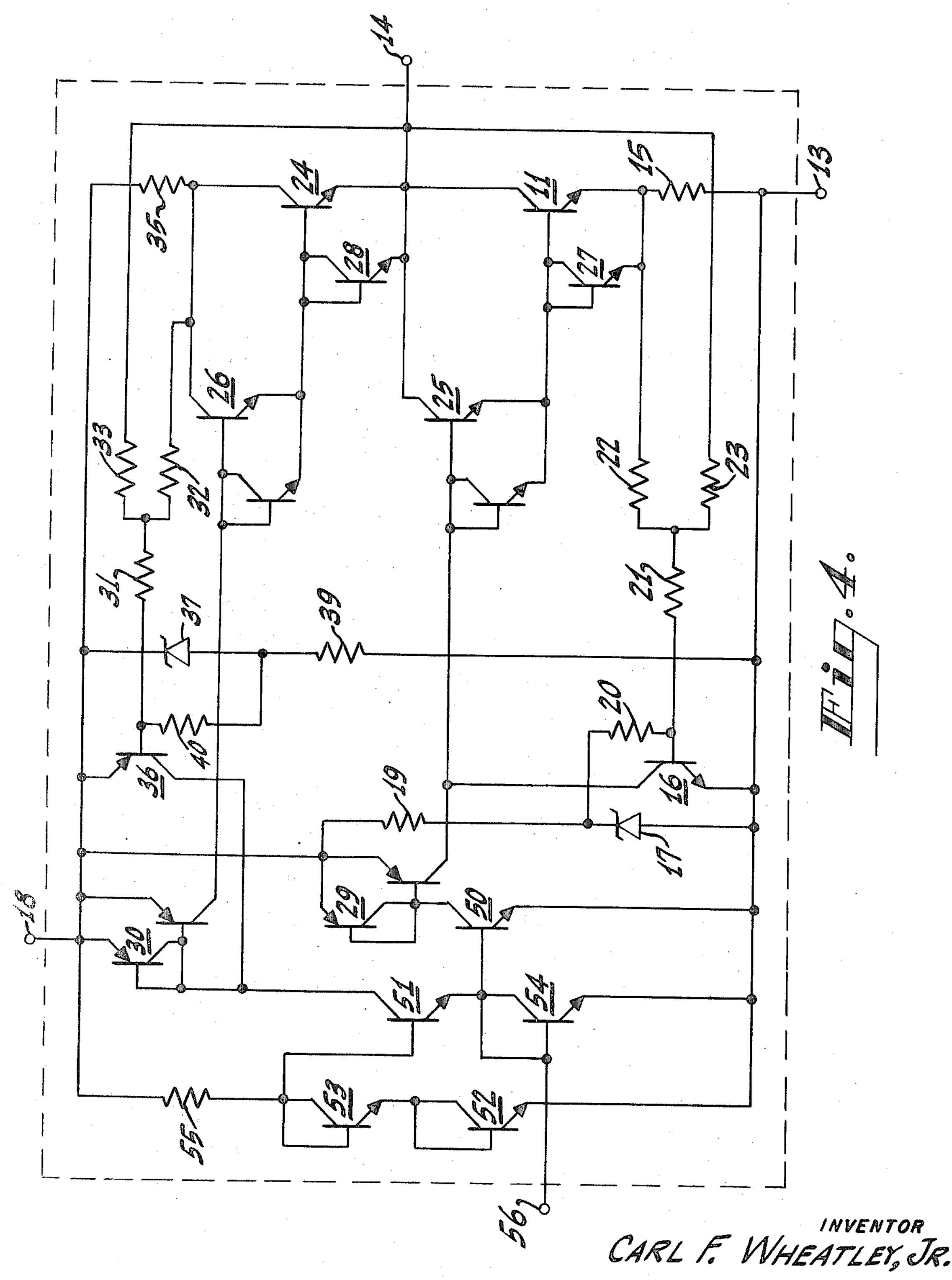
FIG. 4 is a schematic circuit diagram of a transistor amplifier and protection circuit including current and voltage control for the signal drive limiting.

FIG. 4 shows a schematic circuit diagram of a Class B operated power amplifier constructed on a semiconductor chip providing 3 watts of power output. The entire circuit shown within the dashed rectangle is contained on a single semiconductor wafer or chip.

A protection circuit according to the teaching of this invention limits the power dissipation to safe values consistent with the power dissipation capabilities of the output transistors at that semiconductor temperature. Conversely, higher power output and dissipation is possible when the semiconductor chip is maintained at lower temperatures.

The power output circuit comprises a pair of push-pull like conductivity transistors 11 and 24, series connected to drive a load (terminal 14) from their common series connection. Each power output transistor is preceded by a pair of emitter follower driver transistors 25 and 26 providing current gain and power amplification. The power output stages are stabilized in current gain by a pair of transistors 27 and 28 connected as diodes in shunt with the transistor input electrodes. The combination of a diode connected transistor in shunt with the input electrodes of a transistor provides a stable current gain configuration dependent on the relative area of the junctions as constructed on a single integrated circuit chip.

A current input applied to the shunt diode develops a change in diode voltage drop. This voltage is applied to the input of the transistor and controls the emitter injection current into the base region of the transistor. When the base-emitter area of the diode connected transistor on the semiconductor chip is the same as the area of the transistor, the emitter current in the transistor will be equal to the current in the shunt diode. The current gain of the transistor and diode composite is equal to the ratio of the transistor base-emitter junction area to the diode junction area. The gain is stable provided the ratio doesn't become comparable to or larger than the inherent current gain $\beta$ of the transistor device. The transistor and diode composite provides stable current gain and permits Class B bias operation with current bias from a stable current source. The current gain of the transistor and diode composite may be as high as 20 by accurate control of junction area without sacrificing absolute accuracy in predicting the value of the current gain. Current bias of the output transistor pair is then possible because the current gain can be predicted accurately.

Each driver transistor emitter follower 25 and 26 includes a transistor connected as a diode between its base and emitter electrodes as described above in connection with the diodes 27 and 28, the emitter followers 25 and 26 are driven from a pair of current inverter stages 29 and 30 comprising similar gain stabilized transistor and diode composites using transistors of a conductivity type opposite to that of the output transistors. These transistors 29 and 30 may be PNP lateral construction devices which, though they are characterized by low beta current gain may be used as a transistor and diode composite providing stable unity current gain with phase inversion.

Dissipation protection is provided by transistors 16 and 36 for output transistors 11 and 24 respectively as shown in FIG. 4. Component numbers used in the previously described Figures are repeated for the corresponding components in FIG. 4. Resistors 15 and 35 are current sampling resistors connected in series with the current path of output transistors 11 and 24. Resistors 22 and 23 are serially connected across the transistor 11, and resistors 32 and 33 are connected in series across transistor 24 to sample the voltage drops across output transistors 11 and 24. Resistors 15 and 22 are coupled to the input electrode of a protection transistor 16 by a resistor 21. The protection transistors 16 is coupled across the input to transistor 25 to limit the drive to transistor 25 and therefore to transistor 11. Resistors 35 and 32 are coupled to the input electrode of a transistor 36 by means of a resistor 31. Transistor 36 is a protection transistor coupled across the input circuit of transistor composite 30 to limit the drive to transistor 30 and therefore to transistors 26 and 24.

A pair of fixed voltae sources are provided by a pair of Zener diodes 17 and 37 biased into conduction by current through resistors 19 and 39. A pair of resistors 20 and 40 provide a constant bias through resistors 21 and 31 developing a constant voltage bias which is applied to transistors 16 and 36. These fixed voltage sources derive power from the same external source which supplies the operating voltage to output transistors 11 and 24. Economy in external connection terminals to the integrated circuit is therefore achieved by the inclusion of separate Zener diode regulators for each protection circuit.

A Class B bias and phase splitting preamplifier circuit is shown in FIG. 4 comprising a pair of transistors 50 and 51, a pair of bias diodes 52 and 53, and an input circuit shunt diode connected transistor 54. Resistor 55, diodes 52 and 53 are series connected whereby a substantially constant bias current flows through diodes 52 and 53 thereby establishing a drop in voltage across the diodes of two $V_{be}$ units. Diodes 52 and 53 are rather large area devices to establish a low bias source reference voltage.

An input terminal 56 couples an input signal source to the integrated circuit. Diode 54 is connected directly across the input source between terminal 56 and the ground reference common terminal 13. Diode 54 is also coupled between the input electrodes of transistor 50. Transistor 50 and diode 54 operate as a diode and transistor composite, the current gain of which is equal to the ratio of the transistor junction area to the diode junction area. The output of transistor 50 is coupled to the input of composite transistor 29 providing drive power for the output stage 11 through phase inversion in the composite diode and transistor 29.

Transistor 51 is connected as an emitter follower for direct current bias having its base electrode coupled to the bias diodes 52 and 53 to couple via its base-emitter junction a bias voltage to the diode 54. A drop in potential of one $V_{be}$ is sustained across the base emitter input of transistor 51 so that one $V_{be}$ voltage remains to be applied to diode 54. The output of transistor 51 is coupled to the input of composite transistor 30 providing drive power for the output stage 24.

The output stages of the amplifier circuit described above operates Class B. As such the quiescent current through transistors 11 and 24 is very small. Since the amplifier is direct coupled, and exhibits current gain of the order of 400, the quiescent current in the input stages 50 and 51 must not only be equal, but must be a fraction (1/current gain) of that in the output transistors 11 and 24. A problem is presented in that it is necessary and difficult to accurately provide equal and stable currents of such small magnitude in the transistors 50 and 51.

To solve this problem the junction area of the diode 54 is made equal to the areas of the base-emitter diodes of transistors 50 and 51. Thus, the current in transistor 51 is the same as that in diode 54 because the two are in series, and the current in diode 54 is equal to that in transistor 50 for reasons explained above in connection with the diode transistor composites.

To establish the quiescent current in transistor 51 and diode 54, the complement of the current gain stabilized composite transistor-diode circuit is used. The complement is a large area diode biasing a small area transistor thereby providing a current gain of a fraction which is equal to the area of the transistor divided by the area of the diode. Diodes 52 and 53 are large area diodes much larger than the area of transistors 51 and 50, by an accurately defined ratio such as 20:1. In this circumstance resistor 55 is chosen at a value of resistance easily fabricated on an integrated circuit to bias diodes 52 and 53 at a current 20 times the magnitude of the quiescent current which is desired in transistors 51 and 50. Therefore, with the current gain existent between transistor 51 and 24 and between transistor 50 and 11 of typically 400, the quiescent current in diodes 52 and 53 is an easily obtainable one twentieth of the quiescent current in output transistors 11 and 24, and is set by the choice of the resistance value of resistor 55.

Under input signal conditions, the signal source coupled to the input terminal 56 and common terminal 13 effects an increase and decrease in conduction of diode 54 which results in a corresponding increase and decrease in conduction in transistor 50 and output transistor 11. Coincident to the increase in conduction of diode 54, a decrease in conduction occurs in transistor 51 easily resulting in cutoff of transistor 51 and therefore transistor 24. Upon a decrease in conduction of diode 54 by the current flow from the input signal source, the transistor 51 is turned on and is operated in the common base mode to also turn on transistor 24. Under current bias operation of output transistors 11 and 24, the rates of maximum peak current to quiescent current may be large. Under such conditions peak current drive to transistor 51 must also exceed quiescent values by the same ratio. The peak base current supplied to the base of transistor 51 is then peak emitter drive divided by beta and must be supplied by resistor 55. If the ratio of peak drive to quiescent current exceeds beta, then the current available from resistor 55 will not be sufficient if the diode 52, 53 areas equal the area of the base-emitter junction of transistor 51. When diodes 52 and 53 are made larger than transistor 51 junction area by some ratio such as 20:1, then peak base current is available for transistor 51. In this manner Class B operation is simultaneously established for the input circuit phase splitter stage and the power output stages which are direct current coupled to them. The usual problem of providing a high power Class A predriver is therefore circumvented completely and power dissipation on the power amplifier semiconductor chip is entirely power output related with negligible standby power dissipation interfering with the performance of the dissipation circuits.

What is claimed is:

1. An amplifier protection circuit comprising:

an amplifier transistor and a protection transistor each having base, emitter and collector electrodes constructed on the same semi-conductor wafer, means providing a source of direct voltage substantially independent of signal variations equal to the threshold voltage of conductivity of the base emitter junction of said protection transistor at an upper operating limit semiconductor temperature, means connecting said source of direct voltage between the base and emitter electrodes of said protection transistor to effect base emitter junction conduction in said protection transistor for semiconductor temperatures higher than said limit temperature, an input signal circuit including a pair of terminals coupled to the base and emitter electrodes of said amplifier transistor, and means connecting the collector and emitter electrodes of said protection transistor between said pair of terminals whereby said protection transistor provides a low impedance bypass for input signals for semiconductor temperatures higher than said limit temperature.

2. An amplifier protection circuit according to claim 1 and further comprising:

means coupled in series with the emitter-collector current path of said amplifier transistor for sensing said current, and means for coupling said current sensing means to said base-emitter junction of said protection transistor for rendering said protection transistor responsive to predetermined conditions of temperature and current in said amplifier transistor.

3. An amplifier protection circuit according to claim 2 and further comprising:

means coupled between the collector and emitter electrodes of said amplifier transistor for sensing voltage across said electrodes, and means for coupling said voltage sensing means to said base-emitter junction of said protection transistor for rendering said protection transistor responsive to predetermined conditions of current, voltage and temperature of said amplifier transistor.

4. An amplifier protection circuit comprising:

an amplifier transistor having base, emitter and collector electrodes;

a protection transistor having base, emitter and collector electrodes;

a current sampling means coupled in series with the emitter-collector current path of said amplifier transistor, means providing a source of direct voltage bias substantially independent of signal variations equal to the threshold voltage of conductivity of the base emitter junction of said protection transistor at an upper operating limit temperature, means connecting the current sampling means and said source of direct voltage bias in series between the base and emitter electrodes of said protection transistor for rendering said protection transistor responsive to predetermined combinations of operating temperature and amplifier current, an input signal circuit including a pair of terminals coupled to the base and emitter electrodes of said amplifier transistor, and means connecting the collector to emitter current path of said protection transistor between said pair of terminals whereby said protection transistor provides a low impedance signal bypass across said input circuit for excess amplifier current as a function of said protection transistor temperature.

5. An amplifier protection circuit as described in claim 4 wherein a voltage divider means is connected between the collector and emitter electrodes of said amplifier transistor for providing a fraction of the emitter-collector voltage of said amplifier transistor across a portion of said voltage divider, and said means connecting the current sampling means and said source of relatively fixed voltage in series also connects the portion of the voltage divider in series between the base and emitter electrodes of said protection transistor, whereby said protection transistor is also responsive to said amplifier transistor emitter-collector voltage.

6. An amplifier protection circuit as described in claim 4 wherein;

the amplifier transistor and said protection transistor are constructed on a single semiconductor wafer.

7. An amplifier protection circuit comprising:

an amplifier transistor having base, emitter and collector electrodes;

a protection transistor having base, emitter and collector electrodes;

a current sampling means coupled in series with the emitter to collector current path of said amplifier transistor, voltage divider means connected between said current sampling means and a source of relatively fixed voltage for providing a bias voltage across a portion of said voltage divider means substantially equal to the threshold conduction voltage of the base-emitter junction of said protection transistor at an upper operating limit temperature, means connecting said current sampling means and said portion of said voltage divider means in series between the base and emitter electrodes of said protection transistor, and means connecting the collector to emitter path of said protection transistor between the base and emitter electrodes of said amplifier transistor.

8. An amplifier protection circuit as described in claim 7 wherein said amplifier transistor, said protection transistor, said current sampling means, and said voltage divider means are constructed on a single semiconductor wafer as an integrated circuit.

9. An amplifier and protection circuit therefore comprising:

an amplifier transistor having base-emitter and collector electrodes;

a protection transistor having base, emitter and collector electrodes;

a current sampling means coupled in series with the emitter to collector current path of said amplifier transistor, first voltage divider means connected between the collector and emitter electrodes of said amplifier transistor, second voltage divider means connected between a point on said first voltage divider means and a source of relatively fixed voltage, the relative parameters of said first and second voltage dividers being such that a relatively fixed voltage is developed across said second voltage divider means and a portion of said fixed voltage is substantially equal to the threshold conduction voltage of the base-emitter junction of said protection transistor at an upper operating limit temperature, means connecting said current sampling means, a portion of said first voltage divider means, and a portion of said second voltage divier means corresponding to said threshold voltage in series between the base and emitter electrodes of said protection transistor, and means connecting the collector to emitter path of said protection transistor between the base and emitter electrodes of said amplifier transistor.

10. An amplifier and protection circuit as described in claim 9 wherein a portion of said first voltage divider means is common to a portion of said second voltage divider means, the relative parameters of said first and second voltage dividers being such that the relatively fixed voltage is developed across the portion of said first voltage divider means common to said second voltage divider means.

11. An amplifier and protection circuit therefore comprising:

an amplifier transistor having base, emitter and collector electrodes;

a protection transistor having base, emitter and collector electrodes;

current sampling means connected in series with the emitter electrode of said amplifier transistor;

first voltage divider means connected between the collector and emitter electrodes of said amplifier transistor;

second voltage divider means connected across a source of relatively fixed voltage so that a relatively fixed voltage is developed across said second voltage divider means;

means including the current sampling means connecting the collector-to-emitter path of said protection transistor to the base and emitter electrodes of said amplifier transistor; and means connecting said current sampling means, a portion of said first voltage divider means, and a portion of said second voltage divider means in series between the base and emitter electrodes of said protection transistor, said portion of said second voltage divider means providing to said protection transistor a bias voltage substantially equal to the threshold conduction voltage of said protection transistor at an upper operating limit temperature.

* * * * *